(12) United States Patent
Eguchi et al.

(10) Patent No.: US 10,470,347 B2
(45) Date of Patent: Nov. 5, 2019

(54) COMPONENT SUPPLY DEVICE, COMPONENT MOUNTING SYSTEM, AND COMPONENT MOUNTING METHOD

(71) Applicant: Panasonic Intellectual Property Management Co., Ltd., Osaka (JP)

(72) Inventors: Ryouji Eguchi, Yamanashi (JP); Takashi Uchino, Yamanashi (JP); Takashi Tamura, Yamanashi (JP); Shuuichi Kubota, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 121 days.

(21) Appl. No.: 15/190,422

(22) Filed: Jun. 23, 2016

(65) Prior Publication Data

US 2017/0020038 A1 Jan. 19, 2017

(30) Foreign Application Priority Data

Jul. 15, 2015 (JP) ................................. 2015-140990

(51) Int. Cl.
*B23P 19/00* (2006.01)
*H05K 13/04* (2006.01)
(Continued)

(52) U.S. Cl.
CPC ....... *H05K 13/021* (2013.01); *H05K 13/0434* (2013.01); *H05K 13/08* (2013.01); *H05K 13/084* (2018.08)

(58) Field of Classification Search
CPC .... H05K 3/30; H05K 13/0084; H05K 13/021; H05K 13/08; H05K 13/04; H05K 13/046
See application file for complete search history.

(56) References Cited

U.S. PATENT DOCUMENTS 5,727,311 A * 3/1998 Ida ...................... H05K 13/021
29/740
7,003,872 B2 * 2/2006 Mimura ................ H05K 13/08
29/564.1
(Continued)

FOREIGN PATENT DOCUMENTS

| CN | 1832678 A | 9/2006 |
| CN | 101314433 A | 12/2008 |
| JP | 2007-109779 | 4/2007 |

OTHER PUBLICATIONS

Chinese Search Report for the related Chinese Patent Application No. 201610552805.6. dated Sep. 4, 2019.

*Primary Examiner* — Paul D Kim
(74) *Attorney, Agent, or Firm* — Pearne & Gordon LLP

(57) ABSTRACT

A component supply device of the disclosure includes: a loader being capable of accommodating a plurality of stick cases in a stacked state, each of the plurality of stick cases being capable of accommodating a plurality of electronic components, each of the plurality of stick cases having an opening in an end portion in a longitudinal direction; a component transporting path transporting one or more electronic components supplied from the plurality of stick cases to a predetermined component supply position; and a component information storage being capable of storing component information of stick cases. A plurality of electronic components of same lot are accommodated in the plurality of stick cases, and the component information storage stores component information of a stick case read from one of the plurality of stick cases, as the component information of each of the plurality of stick cases.

16 Claims, 10 Drawing Sheets

(51) Int. Cl.
*H05K 13/02* (2006.01)
*H05K 13/08* (2006.01)

(56) References Cited

U.S. PATENT DOCUMENTS

| | | | | |
|---|---|---|---|---|
| 8,196,294 | B2* | 6/2012 | Kino | H05K 13/0408 |
| | | | | 226/110 |
| 8,328,498 | B2* | 12/2012 | Higashida | H05K 13/0452 |
| | | | | 414/749.4 |
| 9,387,299 | B2* | 7/2016 | Zwolinsky | A62B 9/006 |
| 2005/0071997 | A1* | 4/2005 | Oyama | H05K 13/0413 |
| | | | | 29/832 |
| 2008/0147232 | A1* | 6/2008 | Kuribayashi | H05K 13/08 |
| | | | | 700/160 |

* cited by examiner

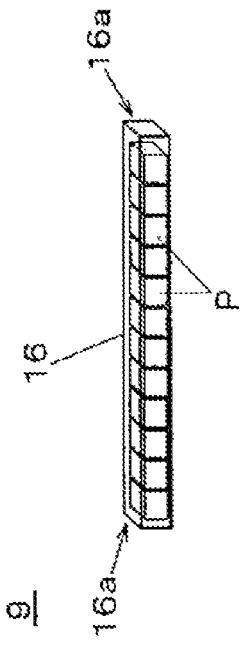
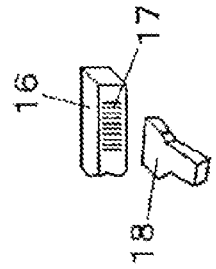
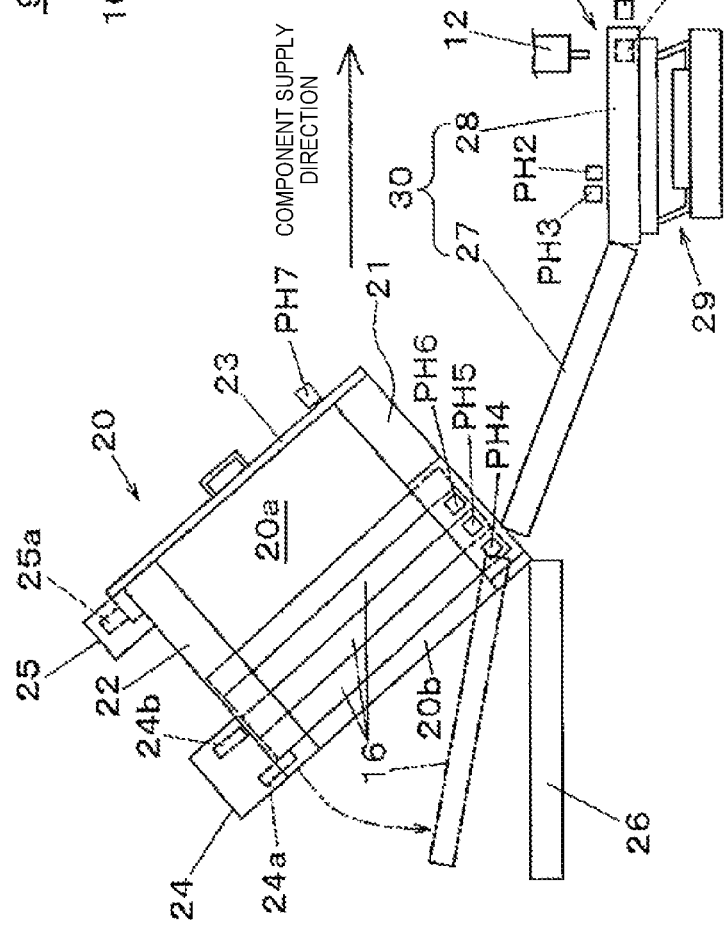

COMPONENT SUPPLY DEVICE, COMPONENT MOUNTING SYSTEM, AND COMPONENT MOUNTING METHOD

BACKGROUND

1. Technical Field

The present disclosure relates to a component supply device which supplies an electronic component, a component mounting system which uses the component supply device, and a component mounting method.

2. Description of the Related Art

In a component mounting system which mounts an electronic component on a substrate, a component mounting operation of unloading the electronic component from a component supply device, such as a tape feeder set in a component mounting device and transferring and loading the electronic component on the substrate, is repeatedly performed. A component mounting device which has a traceability managing function capable of performing a post-retrospective trace by managing and recording a component type or manufacturing lot of the electronic component supplied by the component supply device in the related art, from requirements on the quality management or production management in the component mounting operation, is known (for example, refer to Japanese Patent Unexamined Publication No. 2007-109779). In the related art illustrated in Japanese Patent Unexamined Publication No. 2007-109779, by reflecting timing when a joint of a carrier tape is detected by the tape feeder in mounting history data in which a unit mounting history which makes a mounting point at which the electronic component is loaded on the substrate correspond to the tape feeder which supplies the electronic component is written in a time-series order, and tape changing history information which divides a plurality of mounting points on the substrate for every carrier tape is created.

However, an example of the component supply device which is used in the component mounting device, is a stick feeder which uses a long hollow stick case as a carrier that accommodates the electronic component. In the stick feeder, when a plurality of stick cases in which a plurality of electronic components are accommodated in advance are layered, and one stick case becomes empty by unloading the electronic component, the component for the next target stick case is unloaded in order. In addition, even in the component supply by the stick feeder, it is desirable that the above-described traceability managing function is realized.

SUMMARY

A component supply device of the disclosure includes: a loader being capable of accommodating a plurality of stick cases in a stacked state, each of the plurality of stick cases being capable of accommodating a plurality of electronic components having an opening in an end portion in a longitudinal direction; a component transporting path transporting one or more electronic components supplied from the plurality of stick cases to a component supply position; and a component information storage being capable of storing component information of stick cases. In addition, a plurality of electronic components of same lot are accommodated in the plurality of stick cases, and the component information storage stores component information of a stick case read from one of the plurality of stick cases, as component information of each of the plurality of stick cases.

A component mounting system of the disclosure includes: a component mounting device including a component supply device; and a managing device being connected to the component mounting device by a network. In addition, the component supply device includes a loader being capable of accommodating a plurality of stick cases in a stacked state, each of the plurality of stick cases being capable of accommodating a plurality of electronic components, each of the plurality of stick cases having an opening in an end portion in a longitudinal direction, a component transporting path transporting one or more electronic components supplied from the plurality of stick cases to a component supply position, and a component information storage being capable of storing component information of stick cases. In addition, a plurality of electronic components of same lot are accommodated in the plurality of stick cases, and the component information storage stores component information of a stick case read from one of the plurality of stick cases, as component information of each of the plurality of stick cases.

In a component mounting method in the component mounting system of the disclosure, the component mounting system includes: a component mounting device including the component supply device; and a managing device being connected to the component mounting device by a network, the component supply device includes: a loader being capable of accommodating a plurality of stick cases in a stacked state, each of the plurality of stick cases being capable of accommodating a plurality of electronic components, each of the plurality of stick cases having an opening in an end portion in a longitudinal direction; and a component transporting path transporting one or more electronic components supplied from the plurality of stick cases to a component supply position. In addition, the component mounting method of the disclosure includes: accommodating a plurality of electronic components of same lot in the plurality of stick cases; and storing the component information of a stick case read from one of the plurality of stick cases, as a component information of each of the plurality of stick cases.

BRIEF DESCRIPTION OF DRAWINGS

FIG. 3A is a configuration view illustrating a stick case of the embodiment of the disclosure;

FIG. 3B is a configuration view illustrating a bar code label of the stick case of the embodiment of the disclosure;

FIG. 3C is a configuration view illustrating a stick feeder (component supply device) of the embodiment of the disclosure;

DETAILED DESCRIPTION OF THE PREFERRED EMBODIMENT

Figure 1:
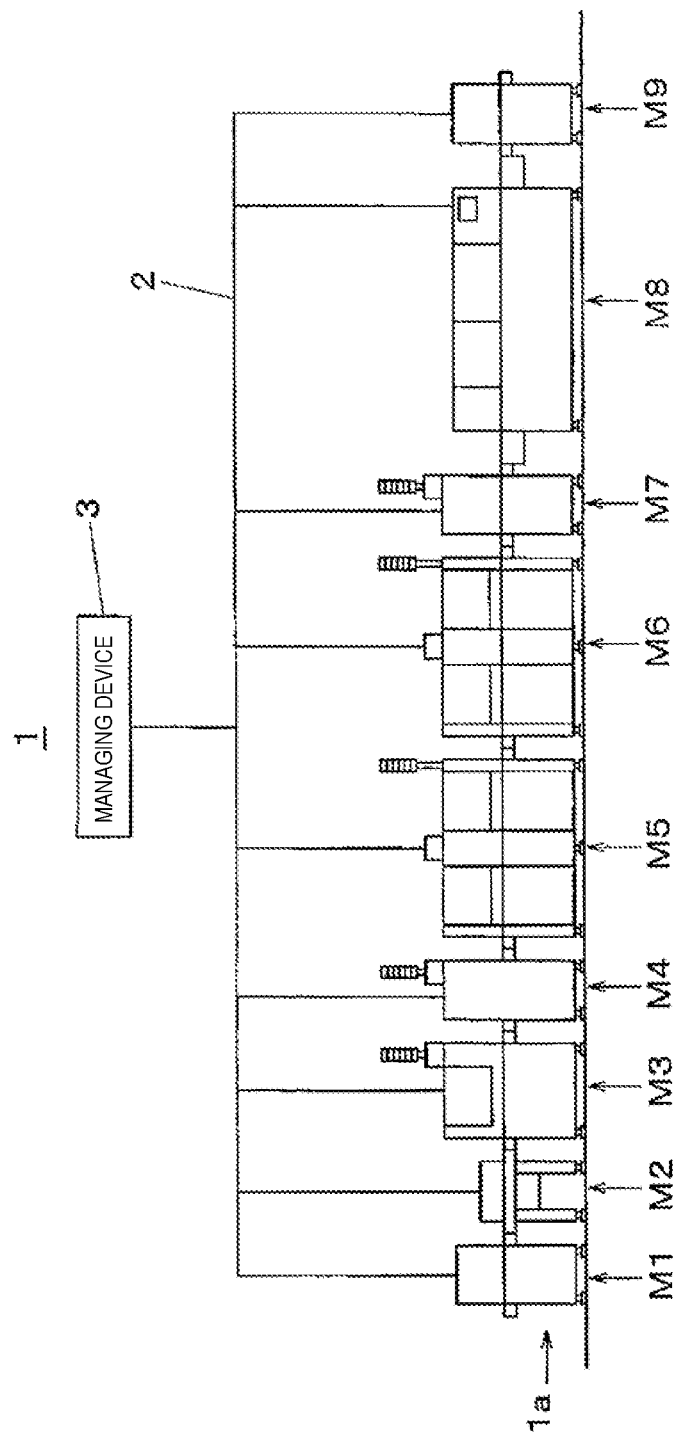
FIG. 1 is a configuration view illustrating a component mounting system of one embodiment of the disclosure.

Next, the embodiment of the disclosure will be described with reference to the drawings. First, with reference to FIG. 1, a configuration of component mounting system 1 will be described. Component mounting system 1 has a function of producing a mounting substrate by mounting the electronic component on the substrate by soldering. In order to perform the component mounting work, component mounting system 1 includes: a component mounting line 1a having a configuration in which substrate supply device M1, substrate delivery device M2, printing device M3, inspection device M4, component mounting devices M5 and M6, inspection device M7, reflow device M8, and substrate collecting device M9 are linked to each other; and managing device 3 which is connected to component mounting line 1a by network 2.

Substrate supply device M1 supplies substrate 6 (refer to FIG. 2) which is a target of the component mounting. Supplied substrate 6 is transported into printing device M3 via substrate delivery device M2. Printing device M3 performs screen printing with respect to the paste-like solder, such as a cream solder, on an electrode for component joining formed on substrate 6. Inspection device M4 performs quality determination of a printing state of the solder printed on the substrate, or printing inspection including the detection of printing position shift of the solder with respect to the electrode. Component mounting devices M5 and M6 consecutively load the electronic component on substrate 6 on which the solder is printed by printing device M3. Inspection device M7 inspects the component mounting state on substrate 6 after the electronic component is mounted. Reflow device M8 solders the electronic component on the substrate by melting the solder by heating substrate 6 after loading the electronic component according to a predetermined temperature profile. Substrate collecting device M9 collects substrate 6 after the reflow and substrate 6 which is a completed product on which the electronic component is mounted.

Figure 2:
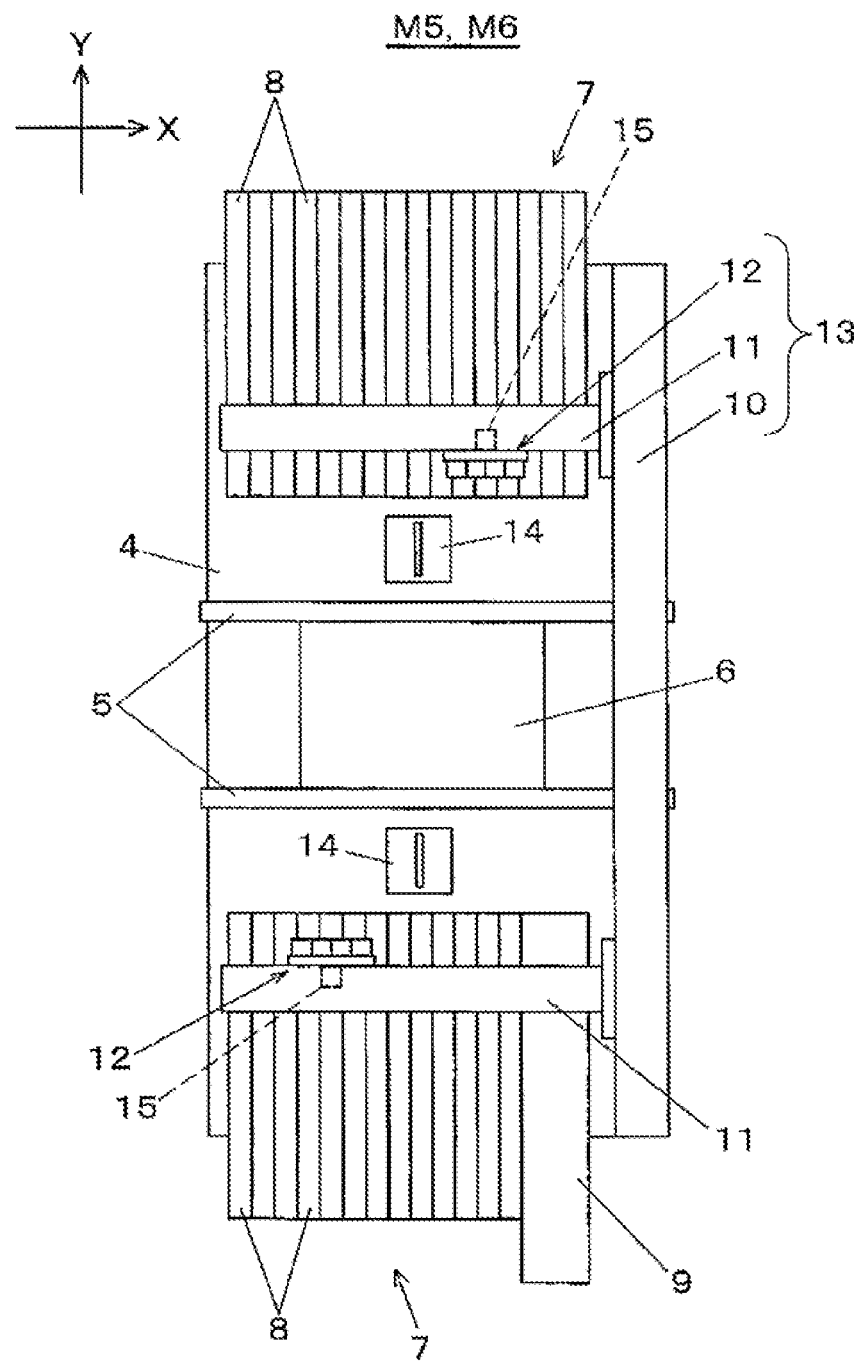
FIG. 2 is a plan view of a component mounting device which configures the component mounting system of the embodiment of the disclosure.

Next, with reference to FIG. 2, a configuration of component mounting devices M5 and M6 will be described. In FIG. 2, substrate transporting mechanism 5 is installed in the X direction (substrate transporting direction) at the center of base 4. Substrate transporting mechanism 5 transports substrate 6 transported from an upstream side, and positions and holds substrate 6 on a mounting stage set for performing the component mounting work. On both sides of substrate transporting mechanism 5, component suppliers 7 are disposed. A plurality of tape feeders 8 are mounted in parallel on one component supplier 7, and stick feeder 9 is mounted on the other component supplier 7 together with the plurality of tape feeders 8.

Tape feeder 8 supplies the electronic component to the component supply position toward a mounting head of the component mounting mechanism which will be described hereinafter, by pitch-feeding a carrier tape accommodating the electronic component in the tape feeding direction. Stick feeder 9 similarly has a function as a component supply device, accommodates stick case 16 in which the plurality of electronic components are accommodated on the inside where an opening is present in the length direction in a stacked state, and similarly supplies the electronic component from stick case 16 to component supply position 28a (FIG. 3C) to the component head. In other words, component mounting system 1 illustrated in the embodiment includes component mounting devices M5 and M6 including stick feeder 9 which serves as a component supply device, and managing device 3 connected to component mounting devices M5 and M6 by network 2.

Y-axis moving table 10 having a linear driving mechanism is installed in an end portion on one side in the X direction on an upper surface of base 4, and two X-axis moving tables 11 similarly having the linear driving mechanism are combined with Y-axis moving table 10 to be freely movable in the Y direction. On two X-axis moving tables 11, each mounting head 12 is mounted to be freely movable in the X direction. By driving Y-axis moving table 10 and X-axis moving table 11, mounting head 12 moves in the X direction and in the Y direction. Accordingly, two mounting heads 12 unload the electronic component from the component supply position by tape feeder 8 or stick feeder 9 that are disposed in each corresponding component supplier 7, and transfer and load electronic component on substrate 6 positioned in substrate transporting mechanism 5. Y-axis moving table 10, X-axis moving table 11, and mounting head 12 configure component mounting mechanism 13 which suction, hold, and unload the electronic component from component supplier 7, and transfers and loads the electronic component substrate 6.

Component recognizing camera 14 is disposed between component supplier 7 and substrate transporting mechanism 5. When mounting head 12 which unloads the electronic component from component supplier 7 moves above component recognizing camera 14, component recognizing camera 14 captures and recognizes the electronic component in a state of being held by mounting head 12. Substrate recognizing camera 15 which is positioned on a lower surface side of X-axis moving table 11 and moves integrally with mounting head 12, is mounted on mounting head 12. As mounting head 12 moves, substrate recognizing camera 15 moves above substrate 6 positioned in substrate transporting mechanism 5, and captures and recognizes substrate 6. In the component mounting operation to substrate 6 by mounting head 12, loading position correction is performed based on the recognition result of the electronic component by component recognizing camera 14 and the substrate recognition result by substrate recognizing camera 15.

Next, with reference to FIGS. 3A to 3C, a configuration and a function of stick feeder 9 will be described. Stick feeder 9 includes loader 20 which accommodates the plurality of stick cases 16 in a stacked state, and component transporter 30. The component transporter 30 has a function of moving the electronic component supplied from stick case 16 in which the electronic component is accommodated, to component supply position 28a which is a position where the electronic component is supplied to mounting head 12 (FIG. 2) of component mounting mechanism 13. Loader 20 is installed in a posture of being inclined in the component supply direction, and includes first guide 21 and second guide 22 disposed facing each other. Stacked space 20a for stacking the plurality of stick cases 16 is formed between first guide 21 and second guide 22.

As illustrated in FIG. 3A, stick case 16 is a hollow elongated container in which openings 16a are provided in both ends, and a plurality of electronic components P are accommodated in series on the inside of stick case 16. In other words, loader 20 has a function of stacking stick case 16 in which the plurality of electronic components P are accommodated, and which has an opening in the length direction.

As illustrated in FIG. 3B, bar code label 17 illustrating component information, such as the name of electronic component P accommodated in stick case 16 or the lot name, is attached to one side end surface of stick case 16, and when stick case 16 is set in loader 20, as an operator reads bar code label 17 by bar code reader 18, the component information is read and component collating processing is performed.

As illustrated in FIG. 3C, lid material 23 which is freely opened and closed is installed in an upper portion of first guide 21 and second guide 22. Lid material 23 has a function of blocking the opening for supplying stick case 16 to loader 20, and is capable of setting stick case 16 in stacked space 20a only in a state where lid material 23 is opened. In a state where stick case 16 is set in stacked space 20a, both end portions of stick case 16 in the longitudinal direction are guided by first guide 21 and second guide 22, and the position is held.

At this time, stick case 16 is in a posture of being inclined in the component supply direction, and a component transporting force in the inclination direction by gravity acts on electronic component P accommodated in stick case 16. Accordingly, electronic component P in stick case 16 positioned on the lowest step in stacked space 20a is transferred to slide linker 27 which is installed to be inclined in the component supply direction. In other words, the position on the lowest step in stacked space 20a becomes a supply position 20b which positions stick case 16 that is a component supply target in loader 20.

The end portion of slide linker 27 is linked to oscillation transporter 28 which is horizontally installed, and oscillation transporter 28 includes oscillation mechanism 29. In a state where oscillation mechanism 29 is driven, when electronic component P is transferred to oscillation transporter 28 from slide linker 27, electronic component P moves on oscillation transporter 28 in the component supply direction. In addition, electronic component P which has reached component supply position 28a is suctioned, held, and unloaded by mounting head 12.

In other words, slide linker 27 and oscillation transporter 28 configure component transporter 30 which moves electronic component P supplied from stick case 16 of loader 20 to predetermined component supply position 28a. In addition, a path through which electronic component P moves in slide linker 27 and oscillation transporter 28 becomes the component transporting path through which electronic component P supplied from stick case 16 of loader 20 is transported to the predetermined component supply position 28a.

In second guide 22 on the opposite side in the component supply direction, stick discharge mechanism 24 and lid member locking mechanism 25 are provided. Stick discharge mechanism 24 has a function of dropping only stick case 16 on the lowest step and discharging stick case 16 to case collector 26 among the plurality of stick cases 16 accommodated in stacked space 20a, by controlling an advancing and retreating operation in stacked space 20a of two locking members 24a and 24b.

In other words, stick case 16 which feeds out all of electronic components P by the component supply and becomes empty is discharged and dropped by stick discharge mechanism 24, and is collected to case collector 26. Accordingly, next stick case 16 which is positioned directly on stick case 16 on the lowest step is positioned at the supply position of electronic component P. In other words, loader 20 includes a supply stick changer which changes stick case 16 positioned at supply position 20b in loader 20.

Lid member locking mechanism 25 has a function of prohibiting an opening operation of closed lid material 23 by controlling the operation of locking member 25a. Accordingly, new stick case 16 is physically prohibited from being supplied to loader 20 in stick feeder 9, and the supply of electronic component P to loader 20 can be restricted only to the predetermined timing set in advance. Therefore, lid material 23 and lid member locking mechanism 25 function as a supply prohibitor which physically prohibits electronic component P from being supplied to loader 20.

In stick feeder 9, seven photo sensors (hereinafter, simply referred to as "sensor") PH1 to PH7 are equipped. Sensors PH1 to PH3 function as component detector 56 (refer to FIG. 4). In other words, sensor PH1 detects whether or not electronic component P has reached component supply position 28a in oscillation transporter 28. In addition, sensors PH2 and PH3 are disposed in oscillation transporter 28 which serves as the component transporting path, and detects electronic component P on the component transporting path, that is, the electronic component P in a state of being moved by oscillation transporter 28. Accordingly, the number of electronic components P which pass through oscillation transporter 28 is counted, and a terminal end of the lot of electronic component P supplied from one stick case 16 can be detected.

In addition, in the embodiment, an example in which two sensors PH2 and PH3 are disposed in oscillation transporter 28 is illustrated, but the positions of sensors PH2 and PH3 are not limited to oscillation transporter 28, and sensors PH2 and PH3 may be disposed in slide linker 27 which is a passing path of electronic component P. Furthermore, instead of installing two sensors PH2 and PH3 in parallel, the count of the number of electronic components P or the terminal end of the lot may be detected only by one sensor.

Among the accommodation positions of stick cases 16 in stacked space 20a, sensors PH4, PH5, and PH6 are installed in order from the lowest step at three lower accommodation positions. Sensors PH4, PH5, and PH6 function as stick case detector 57 (FIG. 4), and detect the presence or the absence of stick case 16 at each accommodation position. In other words, sensors PH4, PH5, and PH6 which function as stick case detector 57 detect the presence or the absence of the plurality of stick cases 16 stacked in loader 20. In lid material 23, sensor PH7 is provided. Sensor PH7 functions as lid member locking detector 58 (FIG. 4), and detects that lid material 23 is closed by lid member locking mechanism 25.

Figure 4:
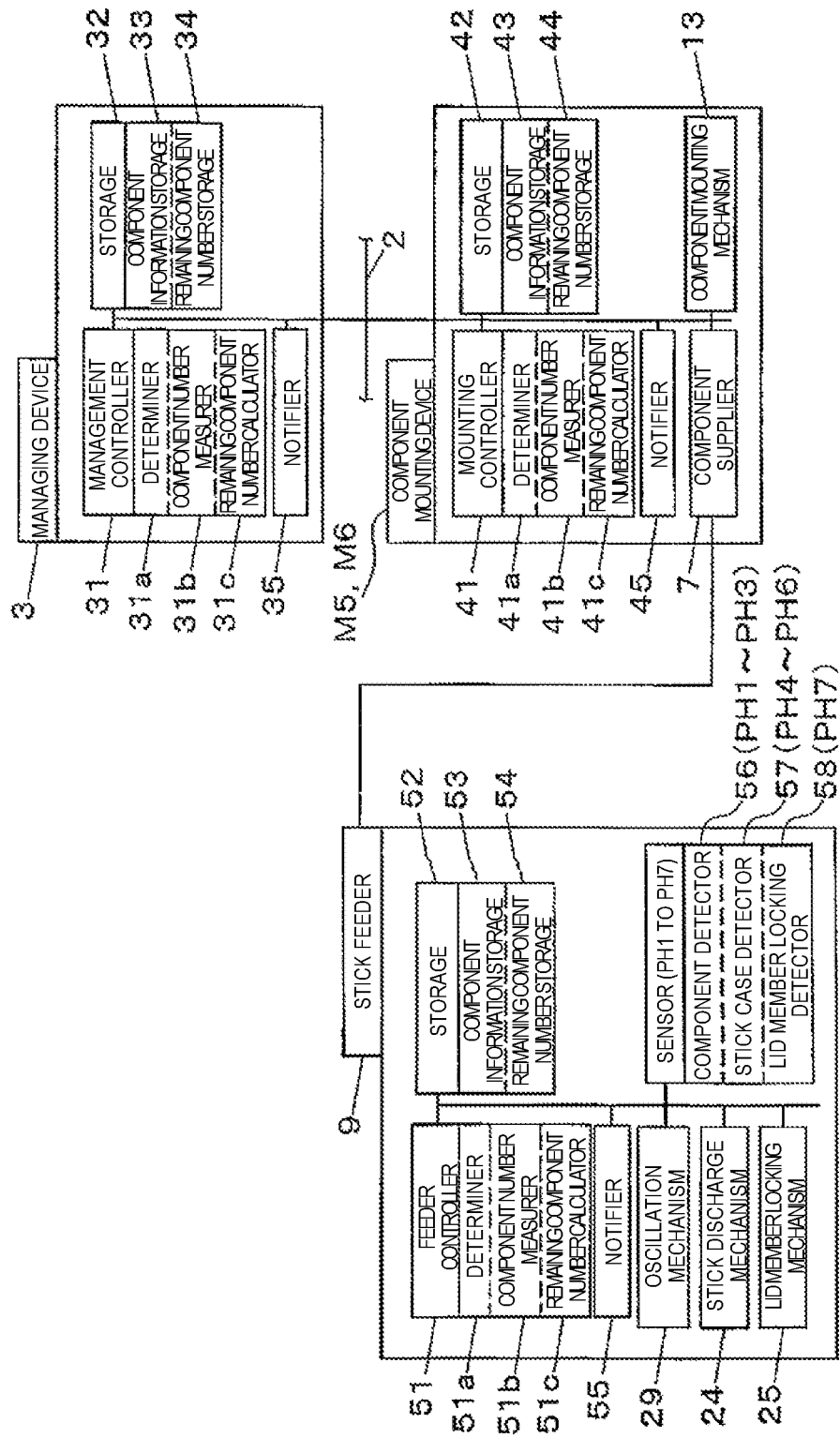
FIG. 4 is a block diagram illustrating a configuration of a control system of a component mounting system of the embodiment of the disclosure.
Figure 5:
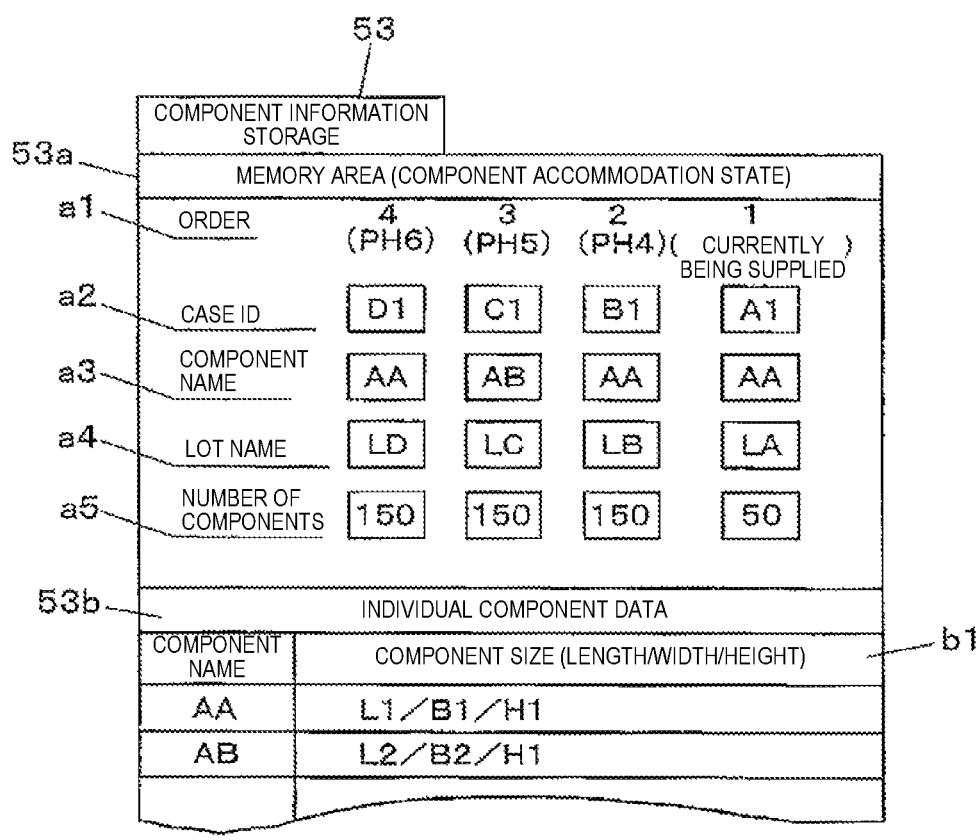
FIG. 5 is a view illustrating storage contents of component information storage in the component supply device of the embodiment of the disclosure.

Next, with reference to FIGS. 4 and 5, a configuration of a control system will be described. In FIG. 4, stick feeder 9 includes feeder controller 51, storage 52, and notifier 55. Furthermore, feeder controller 51 includes determiner 51a, component number measurer 51b, and remaining component number calculator 51c, and storage 52 stores various programs or data which are necessary in the component supply operation in addition to data stored in component information storage 53 and remaining component number storage 54. Component information storage 53 stores the component information of stick case 16 stacked in loader 20, that is, memory area 53a and individual component data 53b that are illustrated in FIG. 5, are stored. Remaining component number storage 54 stores the remaining number of components accommodated in stick feeder 9 at each timing in real time.

Memory area 53a records trace information which is data illustrating a state of component accommodation in stick feeder 9, and illustrating a component supply history by stick feeder 9. Here, every time new stick case 16 is supplied to loader 20, as the operator reads bar code label 17 by bar code reader 18, the component information is input. Individual component data 53b stores attribute data which regulates characteristics of each electronic component, such as component size b1 illustrating the length/width/height of the electronic component, for each component type (component name).

Here, a configuration of memory area 53a will be described. Memory area 53a has a configuration in which each item of "case ID" a2, "component name" a3, "lot name" a4, and "number of components" a5 corresponds to the component supply order illustrated by "order" a1. Here, the order 1 illustrating "order" a1 reaches component supply position 28a and corresponds to electronic component P detected by sensor PH1. The orders 2, 3, and 4 correspond to stick cases 16 positioned in order from the lower end side of stacked space 20a in loader 20, and become detection targets by each of sensor PH4, sensor PH5, and sensor PH6.

"Case ID" a2 is an identification code which individually specifies stick case 16, and the example illustrated in FIG. 5, (A1) illustrated in the order 1 illustrates that electronic component P which has reached component supply position 28a and is currently supplied is the electronic component unloaded from case ID(A1). In addition, (B1), (C1), and (D1) which respectively correspond to the orders 2, 3, and 4 illustrate the case ID which specifies stick case 16 detected by each of sensors PH4, PH5, and PH6 that are stacked on stacked space 20a.

"Component name" a3 and "lot name" a4 illustrate the component name of the electronic component which corresponds to the above-described case ID, and the lot name. In addition, "number of components" a5 illustrates the number of components of the electronic component which corresponds to each "order" a1 in real time. In other words, in the orders 2, 3, and 4 illustrated in "order" a1, since stick case 16 which has not been used is accommodated as it is, (150) which is the initial component accommodation number is illustrated, and in the order 1, a current value (here, 50) which is obtained by subtracting the number of consumed components unloaded from component supply position 28a, from the initial component accommodation number in order, is illustrated.

Feeder controller 51 controls oscillation mechanism 29, stick discharge mechanism 24, and lid member locking mechanism 25, with reference to the detection result from component detector 56 and stick case detector 57, based on various pieces of data and programs stored in storage 52. Accordingly, the component supply operation of transporting electronic component P supplied from stick case 16 stacked on loader 20 to component supply position 28a, and supplying electronic component P to mounting head 12, is performed.

In the component supply operation, determiner 51a determines a state of stick case 16 stacked on loader 20 from a detection state of stick case detector 57 and the component information of stick case 16 stored in component information storage 53 of storage 52. Furthermore, determiner 51a determines the change of the lot of the stick case unit, based on the number of electronic components measured by component number measurer 51b, and the number of electronic components unloaded from component supply position 28a.

In addition, component number measurer 51b measures the number of electronic components P based on the detection result of the sensors PH2 and PH3 which serve as component detector 56. Remaining component number calculator 51c measures the number of remaining components based on the number of electronic components P measured by component number measurer 51b. The measurement result is stored in remaining component number storage 54. Notifier 55 is a display portion, such as a display panel or a signal tower, has a function of performing notification with respect to a work vehicle when a predetermined event regulated in advance occurs. The display panel displays a predetermined notification screen. The signal tower is turned on at a predetermined pattern.

Component mounting devices M5 and M6 include mounting controller 41, storage 42, and notifier 45. Furthermore, mounting controller 41 includes determiner 41a, component number measure 41b, and remaining component number calculator 41c, and storage 42 includes component information storage 43 and remaining component number storage 44. Mounting controller 41 controls component supplier 7 or component mounting mechanism 13 based on various pieces of data or programs stored in storage 42. Accordingly, the component mounting work of mounting electronic component P unloaded from component supplier 7 on substrate 6, is performed.

Managing device 3 includes management controller 31, storage 32, and notifier 35. Furthermore, management controller 31 includes determiner 31a, component number measurer 31b, and remaining component number calculator 31c, and storage 32 includes component information storage 33 and remaining component number storage 34. Management controller 31 manages each device of component mounting line 1a illustrated in FIG. 1 via network 2, based on various pieces of data or programs stored in storage 32. Accordingly, the component mounting work of mounting electronic component P on substrate 6 and producing the mounting substrate, is performed.

In addition, the functions of determiner 41a, component number measure 41b, and remaining component number calculator 41c, and further, the functions of determiner 31a, component number measurer 31b, and remaining component number calculator 31c, are similar to the functions of determiner 51a, component number measurer 51b, and remaining component number calculator 51c. In addition, the configuration of information stored in component information storage 43 and remaining component number storage 44, and further, the configuration of information stored in component information storage 33 and remaining component number storage 34, are similar to the information stored in component information storage 53 and remaining component number storage 54. Therefore, the control processing performed by the control function of stick feeder 9 may be performed by the control function of component mounting devices M5 and M6, or by the control function of managing device 3.

Stick feeder 9, component mounting devices M5 and M6, and component mounting system 1 which are illustrated in the embodiment, are configured as described above, and a specific operation of group component supply for supplying the plurality of stick cases 16 to stick feeder 9 by a group unit in the component mounting method by component mounting system 1 having the above-described configuration, will be described with reference to FIGS. 6 to 9.

Figure 6A:
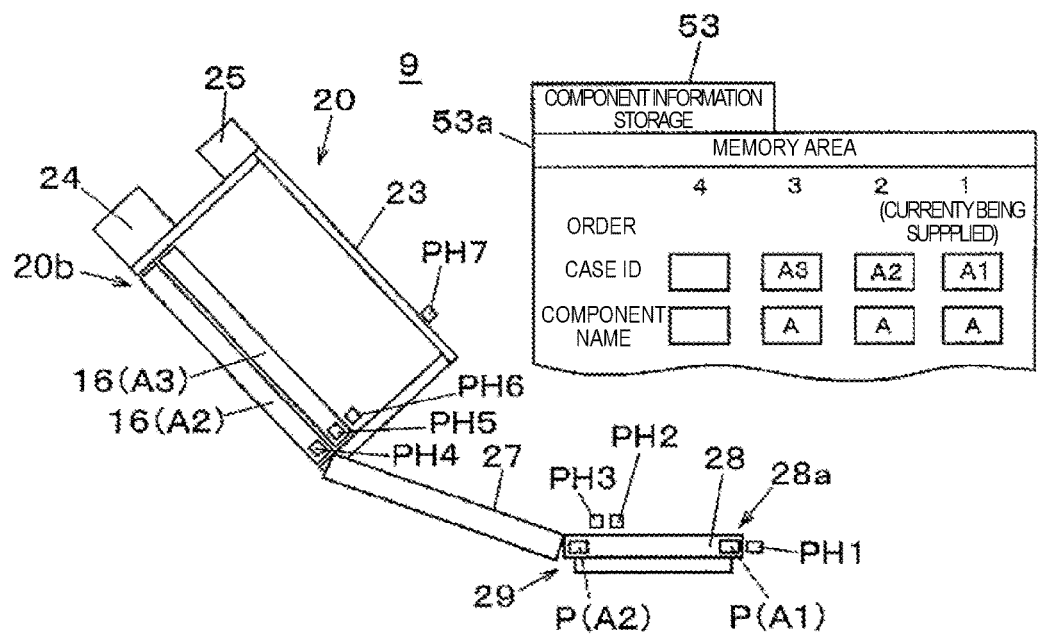
FIG. 6A is a view illustrating a group component supply in the stick feeder of the embodiment of the disclosure.

FIGS. 6A to 9B illustrate a state of stick feeder 9 in the middle of the component supply. First, FIG. 6A illustrates a state where the component supply from stick case 16(A1) is completed, stick case 16(A1) is discharged, and only stick cases 16(A2) and 16(A3) remain on loader 20 in the process of the continuous component supply of electronic components P from three stick cases 16(A1), 16(A2), and 16(A3) which configure a group (here, referred to as an A group) made of the plurality of stick cases 16 of the same lot. Electronic component P(A1) supplied from stick case 16(A1) reaches component supply position 28a via slide linker 27 and oscillation transporter 28, and electronic component P(A2) supplied from stick case 16(A2) reaches oscillation transporter 28.

In addition, in this state, case ID(A1) and component name (A) are written in the order 1 which illustrates that the supply is currently proceeding in memory area 53a, case ID(A1) and component name (A) are written in the order 2 which corresponds to sensor PH4 on loader 20, and further, case ID(A2) and component name (A) are written in the order 3 which corresponds to sensor PH5, respectively. In addition, since stick case 16 which is not present at the position which corresponds to sensor PH6 on loader 20, the order 4 which corresponds to sensor PH6 becomes blank.

Figure 6B:
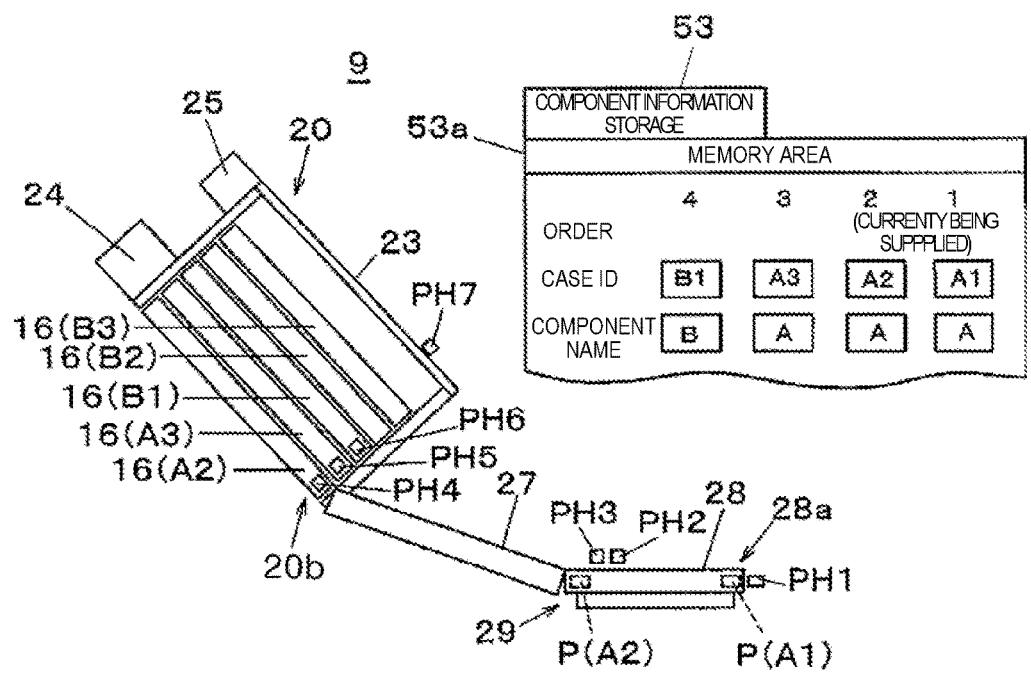
FIG. 6B is a view illustrating the group component supply in the stick feeder of the embodiment of the disclosure.

Here, as sensor PH6 which is at the uppermost step becomes OFF among sensors PH4 to PH6 which serve as stick case detector 57, it is detected that the step number of stick cases 16 stacked on loader 20 becomes equal to or less than a predetermined step number (here, two steps). In other words, stick case detector 57 has a function of detecting that the step number of stick cases 16 stacked on loader 20 becomes equal to or less than the predetermined step number. In this manner, when it is detected that the step number of stick cases 16 becomes equal to or less than the predetermined step number, as illustrated in FIG. 6B, three stick cases 16(B1), 16(B2), and 16(B3) of the same lot which configure a group component (B group) to be supplied next, are supplied to loader 20.

When the group components are supplied to loader 20, supply prohibition by the supply prohibitor which physically prohibits the supply of electronic component P to loader 20, is released. As the supply probihitor locks lid material 23 in a closed state by lid member locking mechanism 25, electronic component P is physically prohibited from being supplied to loader 20. When three stick cases 16(B1), 16(B2), and 16(B3) of the same lot are supplied to loader 20, lid member locking mechanism 25 is controlled by feeder controller 51 (controller), the locked lid material 23 in a closed state is released, lid material 23 becomes opened, and after this, three stick cases 16(B1), 16(B2), and 16(B3) of the same lot are consecutively stacked by an operator.

In addition, after stick cases 16 are supplied to loader 20, until it is detected that sensor PH6 becomes OFF, that is, until stick case detector 57 detects that the step number of stick cases 16 stacked on loader 20 becomes equal to or less than the predetermined step number (here, two steps), feeder controller 51 (controller) prohibits new stick case 16 from being supplied to loader 20. In other words, feeder controller 51 controls lid member locking mechanism 25, and locks lid material 23 in a closed state.

When the above-described three stick cases 16(B1), 16(B2), and 16(B3) are stacked on loader 20, the component information (refer to FIG. 5) which considers only one representative stick case 16 among stick cases 16 as a target, is read. The component information is read as the operator reads bar code label 17 attached to stick case 16 by bar code reader 18 (refer to FIG. 3B). In addition, the read component information is written in component information storage 53 as the component information of each of all of the plural stick cases 16 of the same lot by feeder controller 51. In other words, when the plurality (here, three) of stick cases 16 of the same lot are supplied to loader 20, the component information of one stick case 16 read as a representative stick case among the plurality of stick cases 16, is stored in component information storage 53 as the component information of each of the plurality of stick cases 16.

As illustrated in component information storage 53 in FIG. 6B, among three stick cases 16(B1), 16(B2), and 16(B3) in memory area 53a, only stick case 16(B1) (case ID(B1)) of the order 4 which corresponds to sensor PH6 in loader 20, is displayed. However, the component information of stick cases 16(B2) and 16(B3) is also maintained by component information storage 53. In addition, another stick case 16 which is at the lower step than stick cases 16 on loader 20 is discharged in loader 20, stick cases 16(B2) and 16(B3) consecutively move to the lower step, and accordingly, the maintained component information is displayed in memory area 53a (refer to FIG. 7B).

In addition, after stick cases 16 are supplied to loader 20, until sensor PH6 becomes OFF, that is, until stick case detector 57 detects that the step number of stick cases 16 stacked on loader 20 becomes equal to or less than the predetermined step number (here, two steps), feeder controller 51 (controller) prohibits the component information of stick case 16 which is newly supplied to loader 20 from being stored in component information storage 53.

Figure 7A:
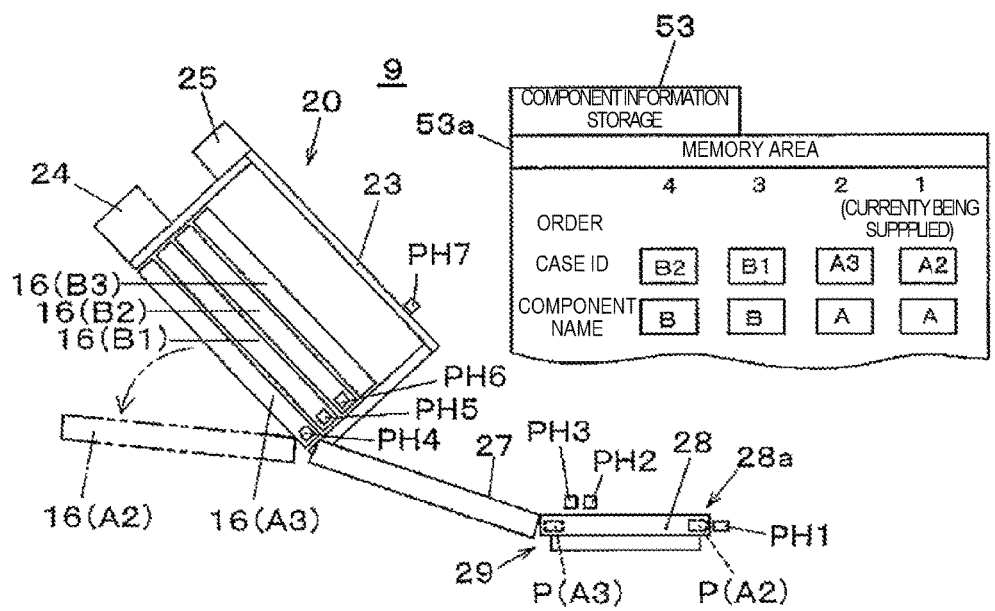
FIG. 7A is a view illustrating the group component supply in the stick feeder of the embodiment of the disclosure.

FIG. 7A illustrates a state where stick case 16(A2) which has completed the component supply becomes empty and is discharged, from the state illustrated in FIG. 6B. In this state, electronic component P(A2) supplied from stick case 16(A2) reaches component supply position 28a of oscillation transporter 28, and electronic component P(A2) supplied from stick case 16(A3) which is the next supply target reaches oscillation transporter 28. In addition, as the component supply from stick case 16(A3) proceeds and stick case 16(A3) becomes empty and is discharged, a state illustrated in FIG. 7B is achieved.

In this state, electronic component P(A3) supplied from stick case 16(A3) reaches component supply position 28a of oscillation transporter 28, and electronic component P(B1) supplied from stick case 16(B1) which is the next supply target is in the middle of moving on slide linker 27. In addition, the component information of the B group which is maintained not being displayed in memory area 53a in FIG. 6B, is displayed with respect to all of three stick cases 16(B1), 16(B2), and 16(B3).

Figure 7B:
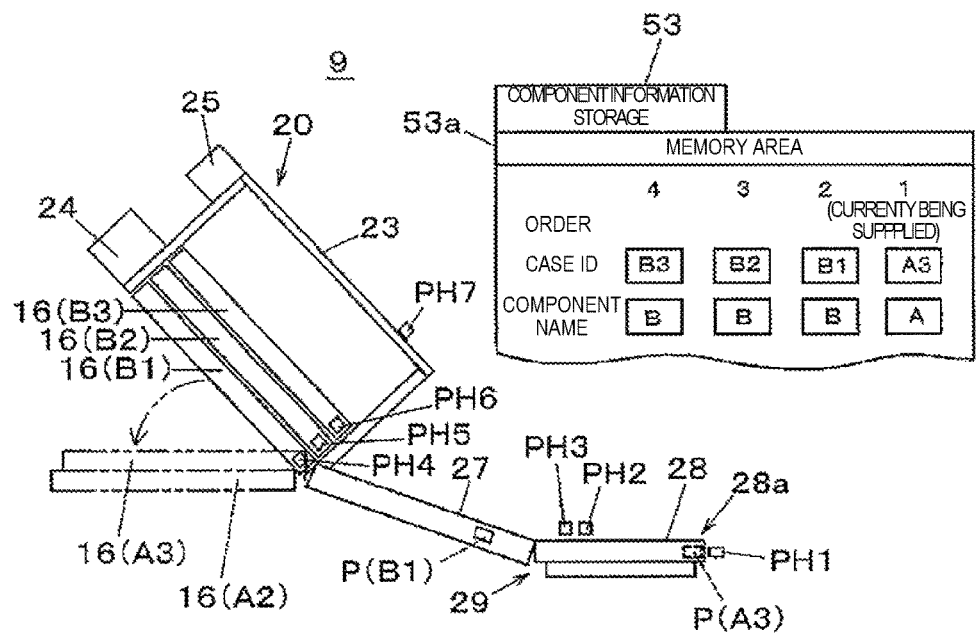
FIG. 7B is a view illustrating the group component supply in the stick feeder of the embodiment of the disclosure.
Figure 8A:
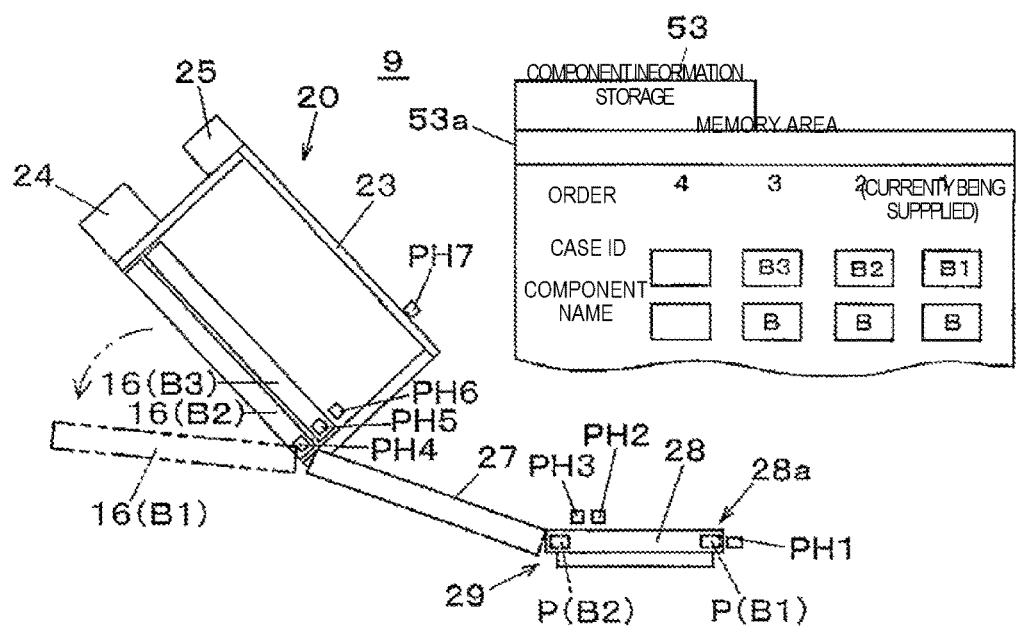
FIG. 8A is a view illustrating the group component supply in the stick feeder of the embodiment of the disclosure.

FIG. 8A is a state where stick case 16 is not present at the position which corresponds to sensor PH6 as a result of the fact that stick case 16(B1) which has completed the component supply becomes empty and is discharged, from the state illustrated in FIG. 7B. In this state, electronic component P(B1) supplied from stick case 16(B1) reaches component supply position 28a of oscillation transporter 28, and electronic component P(B2) supplied from stick case 16(B2) which is the next supply target reaches oscillation transporter 28. In addition, in this state, since stick case 16 is not present at the position which corresponds to sensor PH6 in memory area 53a, the order 4 which corresponds to sensor PH6 becomes blank.

Figure 8B:
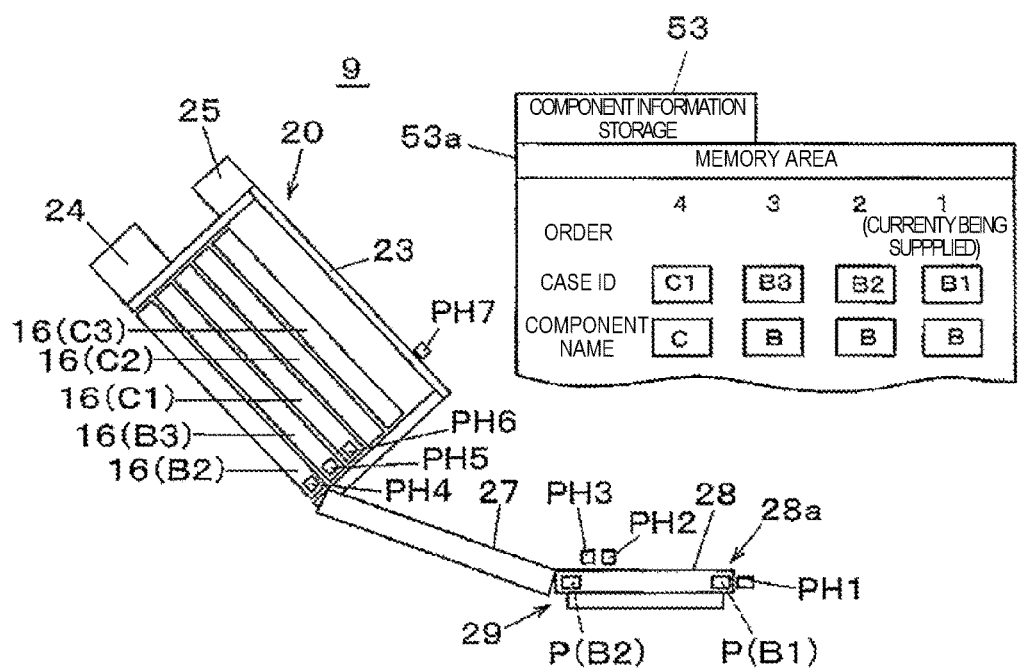
FIG. 8B is a view illustrating the group component supply in the stick feeder of the embodiment of the disclosure.

In other words, stick case detector 57 detects that the step number of stick cases 16 stacked on loader 20 becomes equal to or less than the predetermined step number (here, two steps), and accordingly, the group component to be supplied next can be supplied to loader 20, and considering this state, the next group component is supplied. In other words, as illustrated in FIG. 8B, three stick cases 16(C1), 16(C2), and 16(C3) of the same lot which configure a group component (C group) to be supplied next, are supplied to loader 20.

In addition, after stick cases 16 are supplied to loader 20, until it is detected that sensor PH6 becomes OFF, that is, until stick case detector 57 detects that the step number of stick cases 16 stacked on loader 20 becomes equal to or less than the predetermined step number (here, two steps), feeder controller 51 (controller) prohibits stick case 16 from being newly supplied to loader 20. In other words, feeder controller 51 controls lid member locking mechanism 25, and locks lid material 23 in a closed state.

Here, in a state where lid material 23 is locked in a closed state, when the locked lid material 23 is released by lid member locking mechanism 25 and sensor PH7 detects that lid material 23 becomes opened, feeder controller 51 (controller) determines that the stick supply operation is detected. In other words, lid member locking mechanism 25 and sensor PH7 function as a stick case supply operation detector.

In addition, after the plurality of stick cases 16 are supplied to loader 20, until stick case detector 57 detects that the step number of stick cases 16 stacked on loader 20 becomes equal to or less than the predetermined step number, in a case where the above-described stick case supply operation detector detects the supply operation of stick case 16 to loader 20, feeder controller 51 (controller) notifies the case to the operator by notifier 55. Accordingly, at a timing when the condition of the group component supply is not satisfied, it is possible to prevent defect of the component supply which is caused by the incorrect supply of inaccurate stick case 16 to loader 20.

Figure 9A:
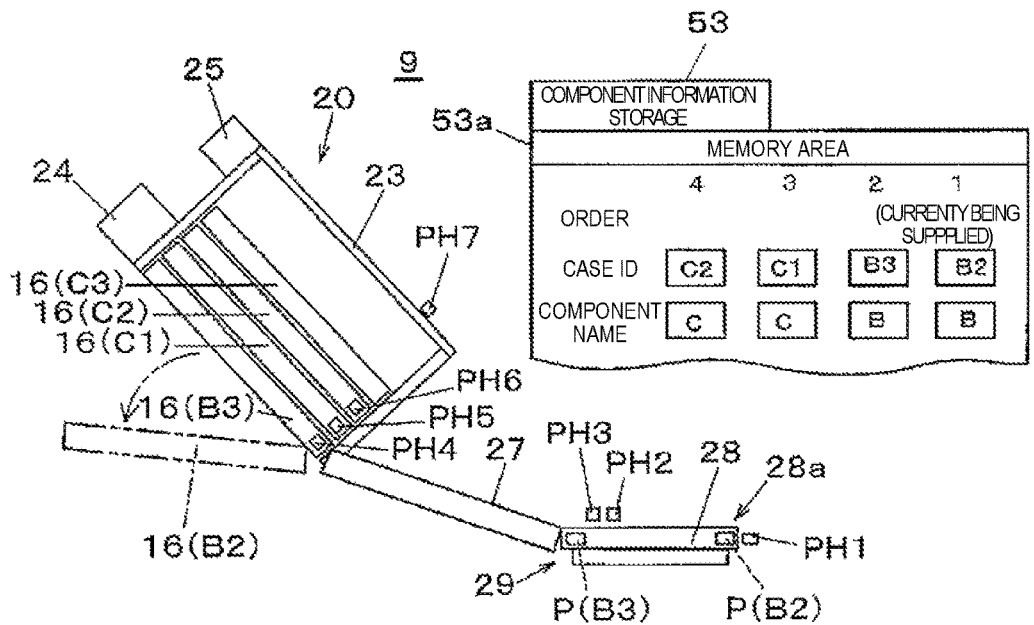
FIG. 9A is a view illustrating the group component supply in the stick feeder of the embodiment of the disclosure.
Figure 9B:
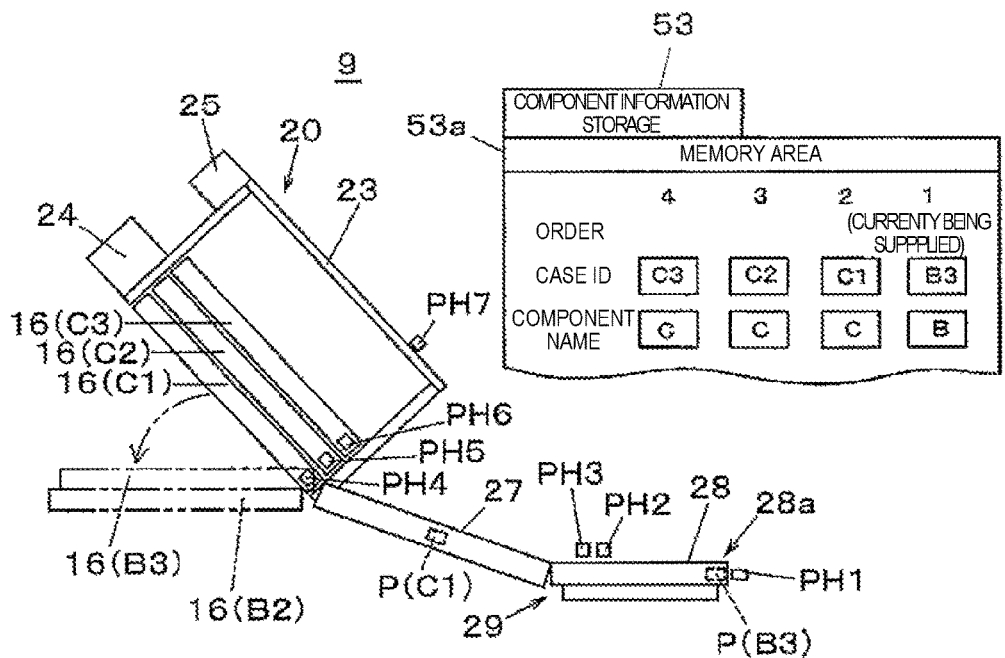
FIG. 9B is a view illustrating the group component supply in the stick feeder of the embodiment of the disclosure.

FIG. 9A illustrates a state where stick case 16(B2) which has completed the component supply becomes empty and is discharged, from the state illustrated in FIG. 8B. In this state, electronic component P(B2) supplied from stick case 16(B2) reaches component supply position 28a of oscillation transporter 28, and electronic component P(B2) supplied from stick case 16(B3) which is the next supply target reaches oscillation transporter 28. In addition, as the component supply from stick case 16(B3) proceeds and stick case 16(B3) becomes empty and is discharged, a state illustrated in FIG. 9B is achieved.

In this state, electronic component P(B3) supplied from stick case 16(B3) reaches component supply position 28a of oscillation transporter 28, and electronic component P(B1) supplied from stick case 16(C1) which is the next supply target is in the middle of moving on "27". In addition, in FIG. 8B, the component information of the C group which is maintained not being displayed in memory area 53a, is displayed with respect to all of three stick cases 16(C1), 16(C2), and 16(C3).

Figure 10:
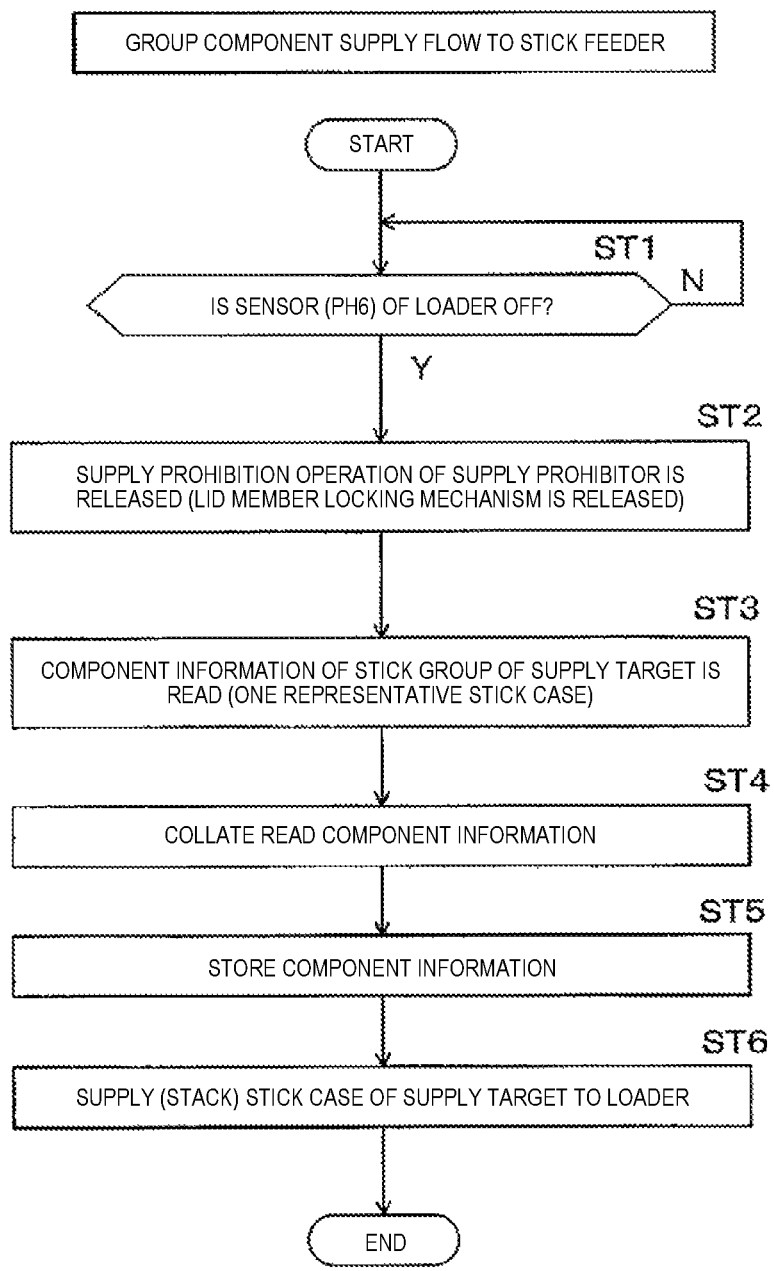
FIG. 10 is a flow diagram of the group component supply in the stick feeder of the embodiment of the disclosure.

FIG. 10 illustrates that the group component supply described in the above-described FIGS. 6 to 9 is summarized in a form of a flow. When the group component supply processing is started, first, it is determined whether or not sensor PH6 of loader 20 is OFF (ST1). Here, in a case where sensor PH6 is not OFF, that is, in a case where stick case detector 57 does not detect that the step number of stick cases 16 stacked on loader 20 becomes equal to or less than the predetermined step number, state monitoring continues until sensor PH6 becomes OFF.

In a case where it is confirmed that sensor PH6 is OFF, that is, in a case where the state illustrated in FIGS. 6A and 8A are achieved, it is determined that the group component supply which supplies the plurality of stick cases 16 of the same lot to loader 20 is possible, and a supply prohibiting operation of the supply prohibitor is released (ST2). In other words, the locked state of lid material 23 due to lid member locking mechanism 25 is released. Accordingly, new stick case 16 can be stacked on loader 20 in a state where lid material 23 is opened.

Next, the component information of the stick group of the supply target is read (ST3). Here, the component information which considers only one representative stick case 16 among stick cases 16 as a target, is read. Next, the read component information is collated (ST4), and the component information is stored in component information storage 53 when the collation result is normal (ST5). In addition, after this, the plurality of stick cases 16 which is the supply target is supplied to loader 20 and stacked (ST6). Accordingly, as illustrated in FIGS. 6B and 8B, the plurality of stick cases 16 are supplied to loader 20 together, and the group component supply processing is completed.

As described above, in stick feeder 9, component mounting system 1, and the component mounting method illustrated in the embodiment, a configuration in which loader 20 in which stick cases 16 are stacked in stick feeder 9 which supplies the electronic component accommodated in stick case 16; a component transporting path which moves the component supplied from stick case 16 of loader 20 to the predetermined component supply position; and a component information storage which stores the component information of one stick case 16 read as a representative stick case among the plurality of stick cases 16 as the component information of each of the plurality of stick cases 16 when supplying the plurality of stick cases 16 of the same lot to loader 20, are included, is employed.

In other words, in stick feeder 9, component mounting system 1, and the component mounting method illustrated in the embodiment, loader 20 being capable of accommodating stick cases 16 in a stacked state, each of stick cases 16 is capable of accommodating electronic components P, which has opening 16a in the end portion in the longitudinal direction; slide linker 27 and oscillation transporter 28 (component transporting path) which transport one or more electronic components P supplied from stick cases 16 to predetermined component supply position 28a; and component information storage 53 which is capable of storing the component information of the stick cases 16 are included. Electronic components P of the same lot are accommodated in stick cases 16, and component information storage 53 stores the component information of stick case 16 read from one stick case 16 among stick cases 16 accommodated in loader 20, as the component information of each of plurality of stick cases 16.

Accordingly, in a case where the plurality of stick cases 16 included in the same lot is handled as a group, and is set in stick feeder 9, it is possible to eliminate great time and effort required in a case where each stick case 16 is individually a collation target, to distinguish the change of the electronic component in stick feeder 9 by a simple method, and to efficiently manage the lot or the type of the supplied electronic component.

In addition, in stick feeder 9 (component supply device), component mounting system 1, and the component mounting method illustrated in the embodiment, stick case detector 57 which detects that the step number of stick cases 16 accommodated in loader 20 is equal to or less than the predetermined step number; and feeder controller 51 (controller) which prohibits another stick case 16 which is different from the plurality of stick cases 16 from being supplied to loader 20 until stick case detector 57 detects that the step number of one or more stick cases 16 accommodated in loader 20 is equal to or less than the predetermined step number after the plurality of stick cases 16 are supplied to loader 20, may be provided.

Furthermore, in stick feeder 9 (component supply device), component mounting system 1, and the component mounting method illustrated in the embodiment, feeder controller 51 may prohibit the component information of another stick case 16 from being stored in component information storage 53 until stick case detector 57 detects that the step number of one or more stick cases 16 accommodated in loader 20 is equal to or less than the predetermined step number after the plurality of stick cases 16 are supplied to loader 20.

In addition, in stick feeder 9 (component supply device), component mounting system 1, and the component mounting method illustrated in the embodiment, loader 20 may include a supply prohibitor (for example, lid material 23 and lid member locking mechanism 25) which physically prohibits stick case 16 from being supplied to loader 20, and feeder controller 51 may prohibit stick case 16 from being supplied to loader 20 by the supply prohibitor (for example, lid material 23 and lid member locking mechanism 25) until stick case detector 57 detects that the step number of one or more stick cases accommodated in loader 20 is equal to or less than the predetermined step number after stick cases 16 are supplied to loader 20.

Furthermore, in stick feeder 9 (component supply device), component mounting system 1, and the component mounting method illustrated in the embodiment, the supply prohibitor may include lid material 23 which blocks an opening which supplies one or more stick cases to the loader, and lid member locking mechanism 25 which locks lid material 23 in a closed state.

In addition, in stick feeder 9 (component supply device), component mounting system 1, and the component mounting method illustrated in the embodiment, loader 20 may include sensor PH7 (stick case supply operation detector) which detects the operation of supplying stick case 16 to loader 20, and feeder controller 51 (controller) may notify that the supply operation of stick case 16 to loader 20 is detected, in a case where sensor PH7 (stick case supply operation detector) detects the supply operation of stick case 16 to loader 20 until stick case detector 57 (sensors PH4 to PH6) detects that the step number of one or more stick cases 16 supplied to loader 20 becomes equal to or less than the predetermined step number after stick cases 16 are supplied to loader 20.

INDUSTRIAL APPLICABILITY

The component supply device, the component mounting system, and the component mounting method of the disclosure have an effect that the change of the electronic component can be distinguished by a simple method in the stick feeder, and the lot or the type of the supplied electronic component can be efficiently managed, and are useful in the field of producing the mounting substrate by mounting the electronic component on the substrate.

What is claimed is:

1. A component supply device comprising:
   a loader;
   a plurality of stick cases positioned within the loader;
   a plurality of electronic components positioned within each of the plurality of stick cases, wherein each of the plurality of electronic components in each of the plurality of stick cases are from the same manufacturing lot;
   a component transporting path through which at least one of the plurality of electronic components supplied from at least one of the plurality of stick cases is transported to a component supply position;
   a component information storage in which component information for each of the plurality of electronic components in each of the plurality of stick cases is stored; and
   a reader configured to read information from only one representative stick case of the plurality of stick cases having electronic components from the same manufacturing lot so that a component collating processing is performed by using read component information before the plurality of stick cases is positioned within the loader,
   wherein the information read from the one representative stick case is stored in the component information storage for each of the plurality of stick cases having components from the same manufacturing lot.

2. The component supply device of claim 1, further comprising:
   a stick case detector detecting a step number of stick cases accommodated in the loader is equal to or less than a predetermined step number; and
   a controller prohibiting another stick case which is different from the plurality of stick cases from being supplied to the loader until the stick case detector detects that the step number of one or more stick cases accommodated in the loader is equal to or less than the predetermined step number after the plurality of stick cases are supplied to the loader.

3. The component supply device of claim 2,
   wherein the controller prohibits component information of the another stick case from being stored in the component information storage until the stick case detector detects that the step number of one or more stick cases accommodated in the loader is equal to or less than the predetermined step number after the plurality of stick cases are supplied to the loader.

4. The component supply device of claim 2,
   wherein the loader includes a supply prohibitor which physically prohibits a stick case from being supplied to the loader, and
   wherein the controller prohibits a stick case from being supplied to the loader by the supply prohibitor until the stick case detector detects that the step number of one or more stick cases accommodated in the loader is equal to or less than the predetermined step number after the plurality of stick cases are supplied to the loader.

5. The component supply device of claim 4,
   wherein the supply prohibitor includes a lid member which blocks an opening for supplying one or more stick cases to the loader, and a lid member locking mechanism which locks the lid member in a closed state.

6. The component supply device of claim 4,
wherein the loader includes a stick case supply operation detector which detects an operation of supplying a stick case to the loader, and
wherein, in a case where the stick case supply operation detector detects a supply operation of stick case to the loader until the stick case detector detects that the step number of one or more stick cases supplied to the loader becomes equal to or less than the predetermined step number after the plurality of stick cases are supplied to the loader, the controller notifies that the supply operation of stick case to the loader is detected.

7. A component mounting system comprising:
a component mounting device including a component supply device; and
a managing device being connected to the component mounting device by a network,
wherein the component supply device includes:
  a reader that reads component information from one of a plurality of stick cases;
  a loader accommodating the plurality of stick cases in a stacked state, each of the plurality of stick cases accommodating a plurality of electronic components of same manufacturing lot, each of the plurality of stick cases having an opening in an end portion in a longitudinal direction,
  a component transporting path transporting one or more electronic components supplied from the plurality of stick cases to a component supply position, and
  a component information storage storing component information of stick cases,
wherein the reader reads the component information prior to the plurality of stick cases being stacked in the loader, and
wherein the component information storage stores the component information from the read stick case as component information for each of the plurality of stick cases stacked in the loader.

8. The component mounting system of claim 7,
wherein the component supply device further includes a stick case detector detecting a step number of stick cases accommodated in the loader is equal to or less than a predetermined step number; and the controller prohibiting another stick case which is different from the plurality of stick cases from being supplied to the loader until the stick case detector detects that the step number of one or more stick cases accommodated in the loader is equal to or less than the predetermined step number after the plurality of stick cases are supplied to the loader.

9. The component mounting system of claim 8,
wherein the controller prohibits component information of the another stick case from being stored in the component information storage until the stick case detector detects that the step number of one or more stick cases accommodated in the loader is equal to or less than the predetermined step number after the plurality of stick cases are supplied to the loader.

10. The component mounting system of claim 8,
wherein the loader includes a supply prohibitor which physically prohibits a stick case from being supplied to the loader, and
wherein the controller prohibits a stick case from being supplied to the loader by the supply prohibitor until the stick case detector detects that the step number of one or more stick cases accommodated in the loader is equal to or less than the predetermined step number after the plurality of stick cases are supplied to the loader.

11. The component mounting system of claim 10,
wherein the supply prohibitor includes a lid member which blocks an opening for supplying one or more stick cases to the loader, and a lid member locking mechanism which locks the lid member in a closed state.

12. The component mounting system of claim 10,
wherein the loader includes a stick case supply operation detector which detects an operation of supplying a stick case to the loader, and
wherein, in a case where the stick case supply operation detector detects a supply operation of stick case to the loader until the stick case detector detects that the step number of one or more stick cases supplied to the loader becomes equal to or less than the predetermined step number after the plurality of stick cases are supplied to the loader, the controller notifies that the supply operation of stick case to the loader is detected.

13. A component mounting method in a component mounting system, the component mounting system including a component mounting device including a component supply device, and a managing device being connected to the component mounting device by a network, the component supply device including a loader being capable of accommodating a plurality of stick cases in a stacked state, each of the plurality of stick cases being capable of accommodating a plurality of electronic components, each of the plurality of stick cases having an opening in an end portion in a longitudinal direction, and a component transporting path transporting one or more electronic components supplied from the plurality of stick cases to a component supply position, the component mounting method comprising:
  accommodating a plurality of electronic components of same manufacturing lot in the plurality of stick cases;
  reading component information from only one representative stick case of the plurality of stick cases wherein the component information includes information about at least one characteristic of the electronic components in the one representative stick case of the stick cases; and
  storing the component information read from the one representative stick case of the stick cases as component information for each of the plurality of stick cases having components from the same manufacturing lot, wherein the stored component information includes characteristics of each of the electronic components.

14. The component mounting method of claim 13, further comprising:
  detecting that a step number of stick cases accommodated in the loader is equal to or less than a predetermined step number; and
  prohibiting another stick case which is different from the plurality of stick cases from being supplied to the loader until it is detected that the step number of one or more stick cases accommodated in the loader is equal to or less than the predetermined step number after the plurality of stick cases are supplied to the loader.

15. The component mounting method of claim 14, further comprising:
  prohibiting component information of a newly supplied stick case from being stored until it is detected that the step number of stick cases stacked in the loader becomes equal to or less than the predetermined step number after the plurality of stick cases are supplied to the loader.

16. The component mounting method of claim 15,
wherein the loader includes a supply prohibitor which physically prohibits a stick case from being supplied to the loader, and
wherein stick case is prohibited from being supplied to the loader by the supply prohibitor until it is detected that the step number of one or more stick cases accommodated in the loader is equal to or less than the predetermined step number after the plurality of stick cases are supplied to the loader.

* * * * *